United States Patent [19]

Engle

[11] 4,401,507

[45] Aug. 30, 1983

[54] METHOD AND APPARATUS FOR ACHIEVING SPATIALLY UNIFORM EXTERNALLY EXCITED NON-THERMAL CHEMICAL REACTIONS

[75] Inventor: George M. Engle, Scottsdale, Ariz.

[73] Assignee: Advanced Semiconductor Materials/AM., Phoenix, Ariz.

[21] Appl. No.: 398,066

[22] Filed: Jul. 14, 1982

[51] Int. Cl.$^3$ .......................... B05D 3/06; B05B 5/02; B44C 1/22; C03C 15/00
[52] U.S. Cl. .................................. 156/643; 118/620; 118/723; 156/646; 156/345; 204/192 EC; 204/192 E; 204/298; 427/39; 427/95
[58] Field of Search ............ 204/192 EC, 192 E, 298, 204/164; 156/643, 646, 345; 427/38, 39, 86, 93, 94, 95; 118/620, 621, 623, 625, 715, 723, 728

[56] References Cited

U.S. PATENT DOCUMENTS 4,292,153  9/1981  Kudo et al. ........................ 427/38 X Primary Examiner—William A. Powell
Attorney, Agent, or Firm—Harry M. Weiss

[57] ABSTRACT

Method and apparatus for improved uniformity in an externally excited non-thermal chemical reaction process. In the inventive process, the reactant is externally activated for a time short compared with the time during which reactant depletion would otherwise occur. The reactant is then deactivated for a period of time comparable to the transit time across the workload. In this way improved uniformity is obtained by reducing the depletion of the reactant as it flows across the workload.

9 Claims, 3 Drawing Figures

METHOD AND APPARATUS FOR ACHIEVING SPATIALLY UNIFORM EXTERNALLY EXCITED NON-THERMAL CHEMICAL REACTIONS

BACKGROUND OF THE INVENTION

1. Field of the Invention

This invention relates generally to improved uniformity in externally excited non-thermal chemical reaction systems, and, more specifically, to such systems wherein the reactant flows over workpieces disposed in a serial manner with respect to the reactant flow.

2. Description of the Prior Art

U.S. Pat. No. 4,223,048 issued to George Engle on Sept. 16, 1980 is hereby incorporated by reference as exemplary of the type of system to which the present invention is applicable. This patent is also exemplary of current state of the art in plasma reactors wherein the reactant gas or gases flow across serially arranged workpieces. Even though the system described in the cited patent represents a considerable improvement in workpiece capacity, undesirable deficiencies in uniformity occur because of the depletion of the reactant as the reactant passes down the tube over the serially-arranged workpieces. For example, in certain deposition processes, workpiece deposit thicknesses or film properties may vary by more than the desired ±5% from one end of the load to the other. Various attempts have been made to compensate for this variation, such as by varying gases, flow rates and pressure, which were inadequate to substantially improve the uniformity. Thus, a need existed to improve the uniformity of certain externally excited non-thermal chemical deposition or etching processes across a load of workpieces serially arranged with respect to the reactant flow.

SUMMARY OF THE INVENTION

In accordance with one embodiment of this invention, it is an object to provide an apparatus and a method for improved uniformity in an externally excited non-thermal chemical reaction process.

It is another object of this invention to provide an apparatus and method for improved uniformity in an externally excited non-thermal chemical reaction process wherein the reactant or reactants flow across or around serially arranged workpieces.

It is a further object of this invention to provide an apparatus and a method for improved uniformity in an externally excited non-thermal chemical deposition process.

It is yet another object of this invention to provide an apparatus and a method for improved uniformity of etch rate, etch profile and selectivity in an externally excited non-thermal chemical etching process.

It is still another object of this invention to provide an apparatus and a method for improved uniformity in an externally excited non-thermal chemical reaction system containing a large number of workpieces.

In accordance with a preferred embodiment of this invention, there is disclosed an apparatus and a method for improving the uniformity in non-thermally activated reaction systems by controlling the excitation waveform such that it is adjusted to be periodically turned on or off for periods determined by the reactant transit time across the workpieces and the reactant depletion time.

The foregoing and other objects, features and advantages of the invention will be apparent from the following, more particular, description of the preferred embodiment of the invention as illustrated in the accompanying drawings.

DETAILED DESCRIPTION OF THE INVENTION

Figure 1:
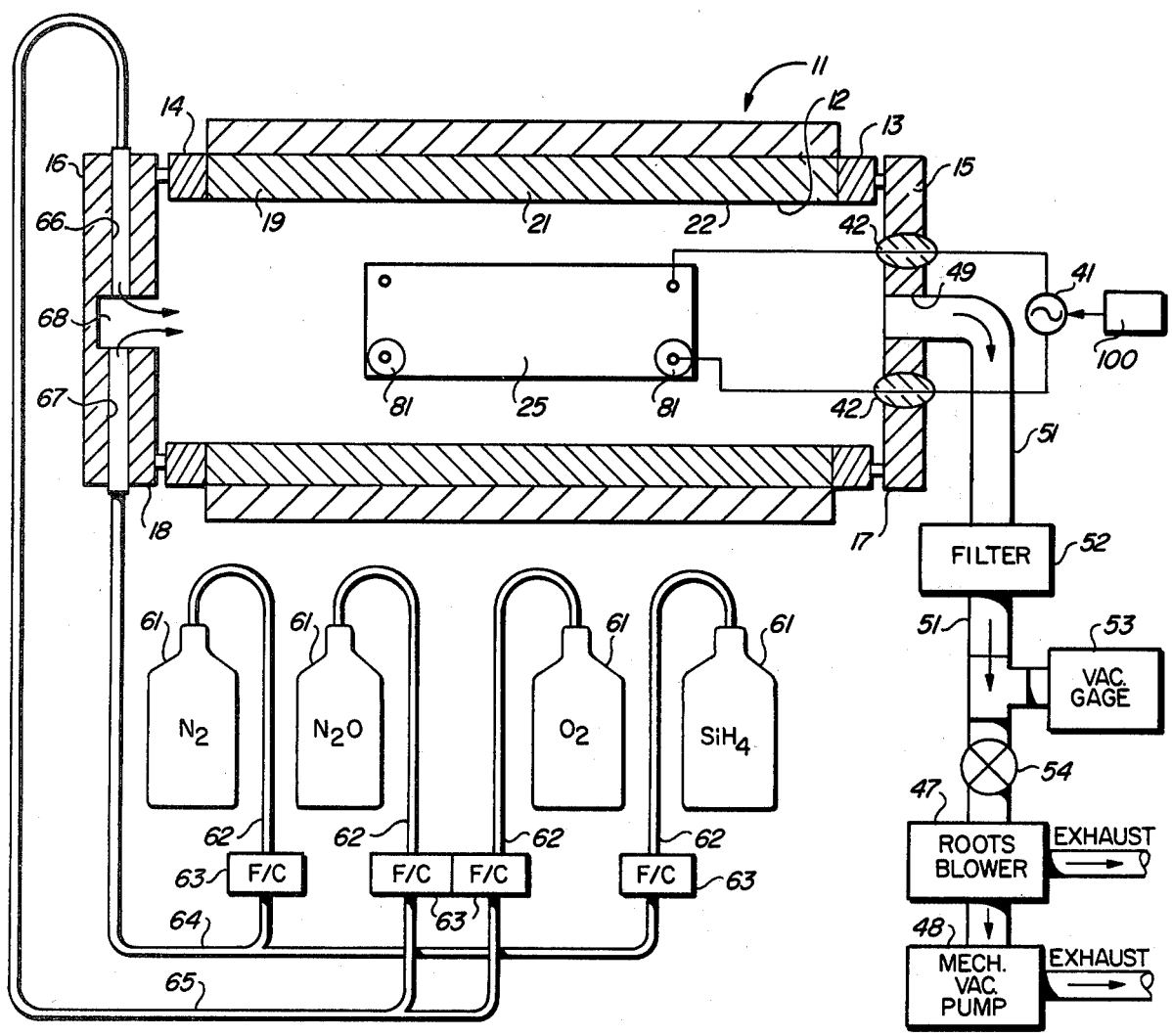
FIG. 1 is a schematic longitudinal sectional view, partly in block diagram form, of a plasma enhanced reaction system incorporating features of the present invention.

Referring to FIG. 1, there is shown a plasma enhanced chemical vapor processing apparatus 11 of a type, with the exception of generator modulator 100 and operation thereof, that is fully described in U.S. Pat. No. 4,223,048 issued to George Engle on Sept. 16, 1980, and is but one of a variety of continuous or pulsed-RF plasma enhanced, laser, photo-excited or other externally excited non-thermal chemical processing systems to which the inventive periodic modulator 100 may be applied.

Using FIG. 1 as an example, a general description of the operation of such systems is as follows:

A reactant or plurality of reactants 61, regulated by flow controllers 63, are passed through tubing 64, 65, into a chamber 11, comprising various structural and sealing elements 15, 16, 17, 18, 19, 21, 22, through inlets 66, 67, 68. In the example of FIG. 1, RF excitation enters the chamber through insulators 42. In laser or photo excited reactors, excitation may enter through a window or other means.

The workpieces (not shown) are disposed between two sets of electrode plates 25. In the configuration of FIG. 1, the electrodes and consequently the workpieces are located linearly along the length of tube 12; however, circular electrodes with radial gas flow and other configurations also may be used. In any configuration, the gas flow is such that the gas passes over or around the workpieces in a certain sequence or order, and is thus subject in prior art, to depletion of concentration and resultant non-uniformity of chemical action, according to the location of each workpiece in the gas flow.

After passing over the workpiece, the gases exit the chamber through outlet 49, tubing 51, and filter 52, and are disposed of through valve 54, blower 47 and vacuum pump 48. The system shown operates below atmospheric pressure, and vacuum is monitored by gauge 53; however the inventive periodic modulator 100 may be applied to the excitation generator 41 of both pressurized and low-pressure systems.

Figure 2:
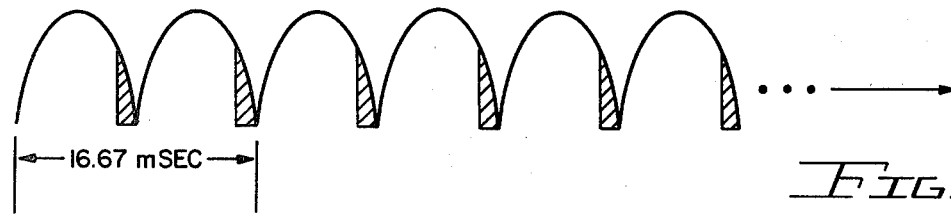
FIG. 2 is an example of the waveforms employed in conjunction with prior externally excited non-thermal chemical reaction systems.

FIG. 2 is illustrative of the amplitude envelope of RF excitation applied to the electrodes of a plasma enhanced chemical vapor processing apparatus such as that of FIG. 1 (with the exception of the generator modulator 100 and the operation thereof). Although the amplitude envelope is conveniently generated from 60 Hz power mains, and is width-modulated, as shown by the shaded area of FIG. 2 so as to control the effective amount of energy transmitted to the plasma electrodes 25, 81, such width modulation is much more rapid than the interruptions imposed by the inventive periodic modulator. Other excitation systems may have width-modulation or other waveforms different from that shown in FIG. 1, or may be continuous excitation means in which intensity or amplitude is varied by means other than width modulation.

Figure 3:
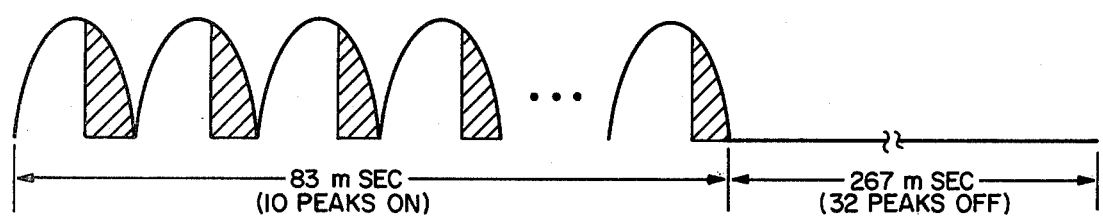
FIG. 3 is an example of an on-off cycle suitable for use with the present invention.

The inventive periodic modulator interrupts the totality of excitation, whether it be width-modulated as is in FIG. 3, continuous, or of other waveform. Said interruptions are timed with a period substantially equal to the transit time required for the flowing reactant to pass from the first upstream workpiece past the last downstream workpiece. Such interruption permits replenishment of reactant concentration or activity to a uniform value, so that downstream workpieces do not suffer from the depleted reactant concentration or activity which in prior art resulted from interaction with upstream workpieces.

While the period during which excitation is "off" is equal to or longer than the reactant transit time from first to last workpiece, the excitation "on" period is equal to or less than the time required for the reactant to pass over one workpiece. In actual practice, where reactant depletion is not significant until the reactant has passed over several workpieces, a relatively longer "on" time may be used. Experimental results show also that substantial improvements in reaction uniformity may still be achieved with "off" times somewhat less than that ordinarily required to completely transit reactant from first to last workpiece; such shorter "off" times conserve reactant, while "off" times in excess of that required for complete transit waste reactant.

To illustrate the effectiveness of the inventive method and apparatus, the process carried out with the plasma enhanced configuration of FIG. 1 and the interrupted waveforms of FIG. 3 achieved a deposition rate variation of only ±2%, compared to variations in excess of a desired ±5% maximum in the same system without the inventive periodic modulator. Parameters in the illustrative example were as follows: A chamber 12 having an interelectrode working zone of 36 inches, contained a workpiece load comprised of 160 3 inch semiconductor wafers arranged in 10 rows of 16 each.

The deposition process in this example deposited $SiO_2$, from the reactants $SiH_4$ (75 sccm) and $N_2O$ (3700 sccm) at a pressure of 1.4 torr and a temperature of 380° C., and plasma power of about 50 watts based on substantially continuous excitation at 16% duty cycle per 60 cycle half wave as shown in FIG. 2. The average deposition rate of 310 Å/minute had a variation in excess of ±5% over the workpiece load comprising 160 3 inch wafers, with the downstream (gas exit) end having the thickest deposit. The activation zone was approximately 36 inches long, and the excitation frequency 410 kilohertz. As shown in FIG. 3, the RF excitation was maintained for 83 msec (10 peaks on) and then interrupted for 267 msec (32 peaks off) to allow for replenishment of the reactant gases. In the foregoing example of $SiO_2$ deposition, the instantaneous power was increased by increasing the duty cycle to 40% per 60 cycle half wave. The gas flow, vacuum, and temperature conditions were substantially unchanged, and the average $SiO_2$ deposition rate was 250 Å/minute with a thickness uniformity across the cited workpiece load improved to ±2%. The composition uniformity was also substantially improved. The 267 msec off time is sufficient for the reactant gases to move an average of 38 inches and hence clear out the depleted gases from the 36 inch reaction zone.

Some variation in the pulse conditions may be tolerated without substantially affecting the results. For example, the excitation may be maintained in the range of 2-14 peaks without significantly affecting the uniformity, although the deposition rate will fall off dramatically if the excitation is supplied for less than 5 peaks. Similarly, the excitation may be removed for 20-40 peaks, with 28-36 peaks being the preferred range for a 36 inch reaction zone and the cited reactant gas flows. Similarly improved uniformity may be obtained at higher or lower gas flow rates with the excitation on/off times adjusted appropriately, e.g. shorter times for higher flow rates.

Similar improvements in uniformity occur for deposition of silicon nitride, single and polycrystalline silicon, as well as etching of various thin films, by use of the apparatus and method of the foregoing description. For systems where reactant gases are optically excited, the photoexcitation may similarly be applied for a short time compared with the reactant gas transit time, and removed for a time approximately commensurate with the transit time.

While the invention has been particularly described with reference to preferred embodiments thereof, it will be understood by those skilled in the art that the foregoing and other changes in form and details may be made without departing from the scope of the invention.

What is claimed is:

1. An apparatus for carrying out an externally excited non-thermal chemical reaction comprising means including an active region for containing a chemical reaction therein, means for creating a non thermal external excitation of said chemical reaction within said active region of said containing means, and control means for substantially interrupting said excitation of said chemical reaction for a period of time substantially equivalent to the transit time of the reactant through said active region of said apparatus.

2. The apparatus of claim 1, further including means for creating said excitation for a time less than the time during which significant depletion of said reactant in said active region would naturally occur.

3. The apparatus according to claim 1 or claim 2, wherein said apparatus comprises means for depositing a film from said reactant.

4. The apparatus according to claim 1 or claim 2, wherein said apparatus comprises means for etching using said reactant as an etchant.

5. A method for carrying out an external excitation of a non-thermal chemical reaction within a container having an active region with at least one reactant located within said container comprising the step of externally exciting a non-thermal chemical reaction within said active region of said container, and substantially interrupting the external excitation of said chemical reaction for a time substantially equivalent to the transit time of said reactant through said active region of said container.

6. The method of claim 5, further including exciting said non-thermal chemical reaction for a time less than the time during which significant depletion of said reactant would naturally occur.

7. The method according to claim 5 or claim 6, further including at least one of RF, Laser, optical and other excitation of said non-thermal chemical reaction.

8. The method of claim 5 or claim 6, wherein including depositing a film from said reactant.

9. The method of claim 5 or claim 6, including etching using said reactant as an etchant.

* * * * *